United States Patent
Kobayashi et al.

(10) Patent No.: US 9,663,871 B2
(45) Date of Patent: May 30, 2017

(54) METHOD FOR FORMING A SINGLE CRYSTAL BY SPRAYING THE RAW MATERIAL ONTO A SEED SUBSTRATE

(71) Applicant: NGK INSULATORS, LTD., Nagoya (JP)

(72) Inventors: Nobuyuki Kobayashi, Nagoya (JP); Kazuki Maeda, Nagoya (JP); Koichi Kondo, Nagoya (JP); Tsutomu Nanataki, Nagoya (JP); Katsuhiro Imai, Nagoya (JP); Jun Yoshikawa, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 323 days.

(21) Appl. No.: 13/866,185

(22) Filed: Apr. 19, 2013

(65) Prior Publication Data

US 2013/0263771 A1    Oct. 10, 2013

Related U.S. Application Data

(63) Continuation of application No. PCT/JP2011/075023, filed on Oct. 31, 2011.

(30) Foreign Application Priority Data

| Nov. 2, 2010 | (JP) | 2010-245948 |
| Mar. 10, 2011 | (JP) | 2011-052458 |
| Aug. 26, 2011 | (JP) | 2011-184848 |

(51) Int. Cl.
*C30B 1/02* (2006.01)
*C30B 1/04* (2006.01)
(Continued)

(52) U.S. Cl.
CPC .......... *C30B 1/04* (2013.01); *C23C 4/12* (2013.01); *C23C 4/123* (2016.01); *C23C 24/04* (2013.01); *C30B 1/00* (2013.01); *C30B 29/406* (2013.01)

(58) Field of Classification Search
CPC .... C30B 1/00; C30B 1/02; C30B 1/10; C30B 28/00; C30B 28/02; C30B 1/04;
(Continued)

(56) References Cited

U.S. PATENT DOCUMENTS 5,868,837 A    2/1999   DiSalvo et al.
2002/0197825 A1  12/2002  Usui et al.
(Continued)

FOREIGN PATENT DOCUMENTS

EP    1 340 583 A1    9/2003
JP    04-042853    *  2/1992
(Continued)

OTHER PUBLICATIONS

European Search Report, European Application No. 11837959, dated Sep. 4, 2014 (7 pages).
(Continued)

*Primary Examiner* — Kenneth A Bratland, Jr.
(74) *Attorney, Agent, or Firm* — Burr & Brown, PLLC (57) ABSTRACT

A crystal production method according to the present invention includes a film formation and crystallization step of spraying a raw material powder containing a raw material component to form a film containing the raw material component on a seed substrate containing a single crystal at a predetermined single crystallization temperature at which single crystallization of the raw material component occurs, and crystallizing the film containing the raw material while maintaining the single crystallization temperature. In the film formation and crystallization step, preferably, the single
(Continued)

crystallization temperature is 900° C. or higher. Furthermore, in the film formation and crystallization step, preferably, the raw material powder and the seed substrate are each a nitride or an oxide.

7 Claims, 4 Drawing Sheets (51) Int. Cl.
*C23C 4/12* (2016.01)
*C23C 24/04* (2006.01)
*C30B 1/00* (2006.01)
*C30B 29/40* (2006.01)
*C23C 4/123* (2016.01)

(58) Field of Classification Search
CPC ........... C30B 1/12; C30B 29/00; C30B 29/10; C30B 29/16; C30B 29/22; C30B 29/36; C30B 29/403; C23C 4/12; C23C 4/123; C23C 24/04
USPC ......... 117/3–4, 7, 9, 84, 107–108, 937, 944, 117/951–952
See application file for complete search history.

(56) References Cited

U.S. PATENT DOCUMENTS

| | | | |
|---|---|---|---|
| 2006/0068105 A1 | 3/2006 | Osawa | |
| 2006/0125352 A1* | 6/2006 | Sakashita | C23C 24/04 310/358 |
| 2006/0223244 A1* | 10/2006 | Nihei | B41J 2/161 438/166 |
| 2007/0160872 A1 | 7/2007 | Iwata | |
| 2008/0003458 A2* | 1/2008 | Iwata | B01J 3/08 428/698 |

FOREIGN PATENT DOCUMENTS

| | | |
|---|---|---|
| JP | 04-042853 A1 | 2/1992 |
| JP | 06-049656 A1 | 2/1994 |
| JP | 2003-178984 A1 | 6/2003 |
| JP | 2003-267796 A | 9/2003 |
| JP | 2005-203761 A | 7/2005 |
| JP | 2006-188046 A1 | 7/2006 |
| JP | 2006-298747 AI | 11/2006 |
| JP | 2008-222489 A | 9/2008 |
| JP | 2008-285339 * | 11/2008 |
| JP | 2008-285339 A1 | 11/2008 |
| JP | 2009-132944 A | 6/2009 |

OTHER PUBLICATIONS

Chun, et al., "Deposition Mechanism of Dry Sprayed Ceramic Particles at Room Temperature using a Nano-Particle Deposition System," Acta Materialia, Elsevier, vol. 59, No. 7, Jan. 4, 2011, pp. 2693-2703.

International Search Report and Written Opinion dated Jan. 24, 2012.

Maxim Lebedev, et al., "*Substrate Heating Effects on Hardness of an α-$Al_1O_3$, Thick Film Formed by Aerosol Deposition Method,*" Journal of Crystal Growth, 2005, vol. 275, pp. e1301-e1306 (6 pages).

Atsushi Iwata, et al., "*Hexagonal to Cubit Crystal Structure Transformation During Aerosol Deposition of Aluminzun Nitride,*" Journal of Crystal Growth, 2005, vol. 275, p. e1269-e1273 (5 pages).

* cited by examiner

METHOD FOR FORMING A SINGLE CRYSTAL BY SPRAYING THE RAW MATERIAL ONTO A SEED SUBSTRATE

BACKGROUND OF THE INVENTION

1. Field of the Invention

The present invention relates to a crystal production method.

2. Description of Related Art

Conventionally, as the crystal production method, there is known a method in which a melt of raw materials for a single crystal to be fabricated is prepared, and the melt is precipitated on a single crystal serving as a seed. However, it has been difficult to apply this method to materials which have a very high melting point or which are apt to be decomposed, such as high-melting-point oxides, e.g., ZnO, nitrides (e.g., GaN), and carbides (e.g., SiC). Accordingly, for example, regarding GaN, a Na-flux method has been proposed in which raw materials are melted, using Na as a flux, and precipitated on a seed to obtain a single crystal (for example, refer to Patent Document 1). Furthermore, a method has been proposed in which a GaN phase is formed using hydride vapor phase epitaxy on a heterogeneous substrate, such as sapphire, and after the growth of the GaN phase, the heterogeneous substrate is removed, thereby to obtain a self-supporting, GaN single crystal substrate (for example, refer to Patent Document 2). Furthermore, an aerosol deposition process has been proposed in which by spraying an aerosol of a raw material powder onto a single-crystal substrate, a film containing a raw material component is formed on the substrate, and then by performing heat treatment, a single crystal is grown (for example, refer to Patent Document 3).

Patent Document 1: U.S. Pat. No. 5,868,837
Patent Document 2: JP 2003-178984 A
Patent Document 3: JP 2006-298747 A

SUMMARY OF THE INVENTION

However, in the crystal production method described in Patent Document 1, the growth rate is low, for example, 0.02 mm/h or less. Furthermore, in the crystal production method described in Patent Document 2, vapor phase epitaxy is performed, and it is difficult to form a thick bulk single crystal with a thickness of several millimeters or more. In the crystal production method described in Patent Document 3, when a step of forming a film on a substrate composed of a single crystal and growing the single crystal by heat treatment is performed repeatedly, voids may be generated in some cases. Thus, the method is still not sufficiently developed to obtain crystals that can be practically used.

The present invention has been achieved in view of such problems. It is a main object of the present invention to provide a crystal production method capable of fabricating a crystal having better orientation and density.

The present inventors have performed thorough studies in order to achieve the main object described above, and have found that when a raw material powder is sprayed onto a seed substrate and crystal growth is performed at the same time at a temperature at which single crystallization of the raw material powder for a single crystal occurs, it is possible to fabricate a crystal having better orientation and density, thus completing the present invention.

That is, a crystal production method according to the present invention includes a film formation and crystallization step of spraying a raw material powder containing a raw material component to form a film containing the raw material component on a seed substrate containing a single crystal at a predetermined single crystallization temperature at which single crystallization of the raw material component occurs, and crystallizing the resulting film containing the raw material component while maintaining the single crystallization temperature.

In the crystal production method according to the present invention, it is possible to fabricate a crystal having better orientation and density. Although the reason for this is not clear, the following assumption can be made: For example, in an aerosol deposition process (AD process) carried out under reduced pressure, a powder jet deposition process (PJD process) carried out under increased pressure, or the like, powder that has collided with a substrate is subjected to plastic deformation by impulsive force and thus densely fixed, and by repeating this phenomenon, a film is formed. However, as the thickness increases, voids tend to remain (refer to JP 2009-132944 A). In contrast, in the crystal production method according to the present invention, since film formation is performed under heat treatment conditions for single crystallization, while being single-crystallized successively, the deposited dense film structure increases in thickness. Therefore, voids are unlikely to occur, and it is possible to fabricate a crystal having better orientation and density. Furthermore, the crystal production method according to the present invention can facilitate crystal growth of nitrides, such as GaN, AlN, InN, and a mixed crystal of these (AlGaInN), which are difficult to melt, carbides, such as SiC, and the like, and therefore, this method in particular has great industrial significance. Furthermore, regarding a substance, such as ZnO, which has a high melting point and cannot be melted, but whose crystals can be fabricated by a hydrothermal process, in the crystal production method according to the present invention, trace elements required for imparting semiconductivity can be easily adjusted, which is difficult in the hydrothermal process, and therefore, this method in particular has great industrial significance. As described above, in the crystal production method according to the present invention, it is assumed that crystals that can be practically used (for example, single crystals) can be fabricated.

DETAILED DESCRIPTION OF THE INVENTION

Figure 1:
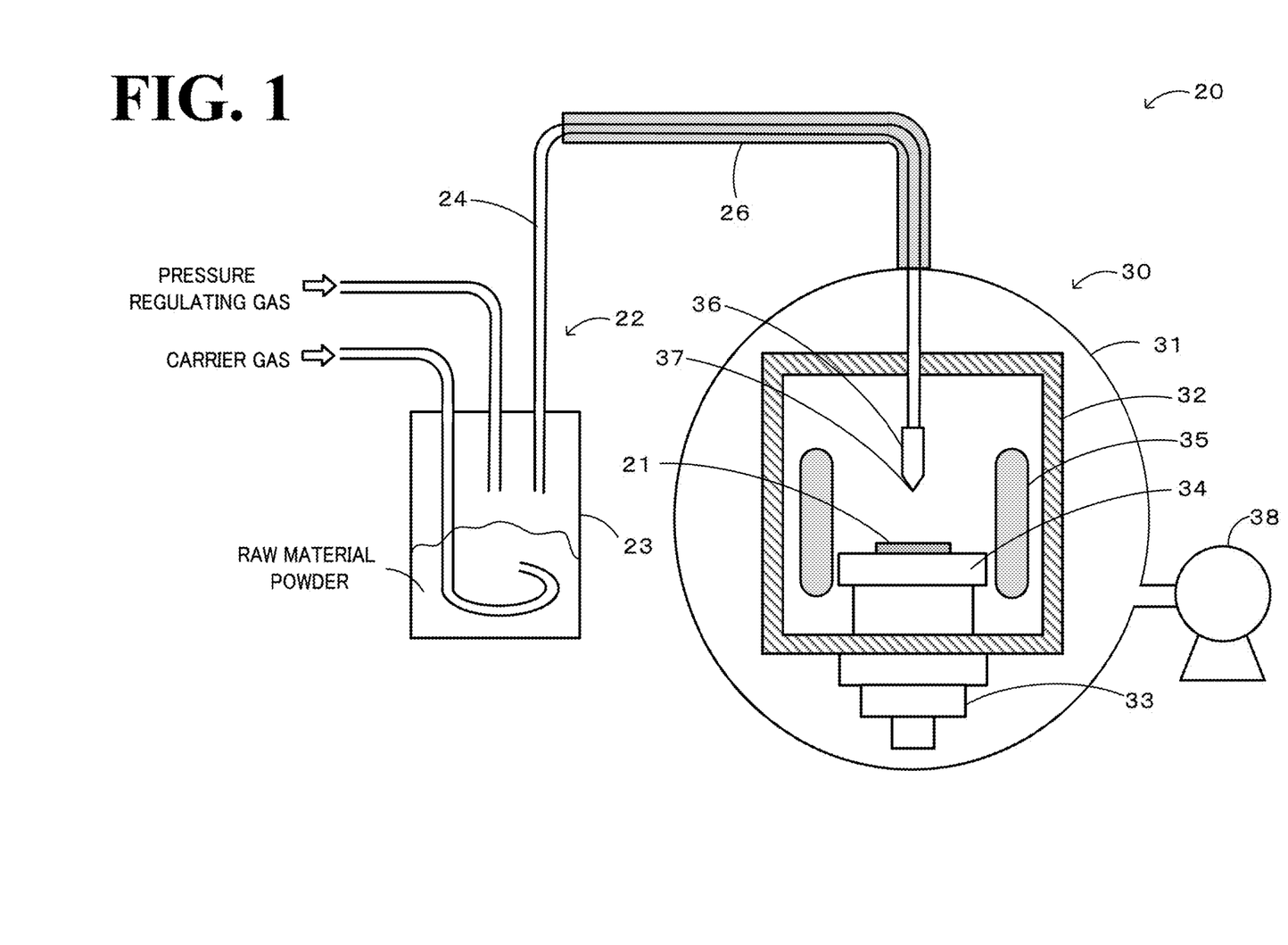
FIG. 1 is a schematic view showing a structure of a crystal production apparatus 20.

Embodiments of the present invention will be described below with reference to the drawings. FIG. 1 is a schematic view showing a structure of a crystal production apparatus 20 used in a crystal production method of the present invention. The crystal production apparatus 20 is configured as an apparatus to be used in an aerosol deposition process (AD process) in which a raw material powder is sprayed onto a seed substrate in an atmosphere having a pressure lower than the atmospheric pressure. The crystal production apparatus 20 includes an aerosol generation unit 22 which generates an aerosol of a raw material powder containing a raw material component, and a crystal formation unit 30 which sprays the raw material powder onto a seed substrate 21 to form a film containing the raw material component and crystallizes the film. The aerosol generation unit 22 includes an aerosol generation chamber 23 which contains a raw material powder and generates an aerosol using a carrier gas supply from a gas cylinder (not shown), and a raw material feed pipe 24 which feeds the resulting aerosol into the crystal formation unit 30. A preheating device 26 which preheats the aerosol is placed on the crystal formation unit 30 side of the raw material feed pipe 24 such that the preheated aerosol can be supplied into the crystal formation unit 30. The crystal formation unit 30 includes a vacuum chamber 31 in which the aerosol is sprayed onto the seed substrate 21, a compartment-like heat insulator 32 provided inside the vacuum chamber 31, a substrate holder 34 which is placed inside the heat insulator 32 and fixes the seed substrate 21, and an X-Y stage 33 which moves the substrate holder 34 in the X-axis and Y-axis directions. Furthermore, the crystal formation unit 30 includes a heating member 35 which is placed inside the heat insulator 32 and heats the seed substrate 21, a spray nozzle 36 which has a slit 37 on the head and sprays the aerosol onto the seed substrate 21, and a vacuum pump 38 which reduces the pressure of the vacuum chamber 31. In the crystal production apparatus 20, the individual members are composed of quartz glass, a ceramic, or the like so that heating treatment can be performed at a temperature at which single crystallization of the raw material powder occurs, for example, at 900° C. or higher, in the vacuum chamber 31. A crystal production method using the crystal production apparatus 20 will be described below.

Film Formation and Crystallization Step

In this step, a film formation process in which a raw material powder containing a raw material component is sprayed to form a film containing the raw material component on a seed substrate containing a single crystal at a predetermined single crystallization temperature at which single crystallization of the raw material component occurs, and a crystallization process in which the film containing the raw material is crystallized while maintaining the predetermined single crystallization temperature are performed.

In the film formation process, the raw material powder containing a raw material component is not particularly limited as long as it forms a single crystal, and examples thereof include powder containing an oxide, a nitride, a carbide, or the like. Among them, examples of the oxide include ZnO. Furthermore, examples of the nitride include GaN, AlN, InN, and a mixed crystal of these (AlGaInN). Among these, GaN is preferable. Furthermore, examples of the carbide include SiC. The raw material powder, when used in the AD process, is preferably composed of primary particles which are not aggregated (each of which does not include grain boundaries). The particle size is, for example, preferably 0.05 to 10 μm, and more preferably 0.2 to 2 μm. The particle size is defined as the median diameter (D50) measured by dispersing particles in a dispersion medium (organic solvent, water, or the like), using a laser diffraction/scattering particle size distribution analyzer. Furthermore, the raw material powder may be subjected in advance to milling treatment using a ball mill, a planetary ball mill, a jet mill, or the like. By performing this treatment, the surface properties and crystallinity are changed, and the deposition rate in the AD process can be improved. Furthermore, the raw material powder may be subjected to heat treatment. By performing this treatment, the density of the film formed by the AD process can be improved. In the film formation process, the seed substrate may be composed of the same component as the raw material component, and examples thereof include oxides, nitrides, and carbides. The seed substrate includes a single crystal. For example, the seed substrate may be a single crystal substrate or a support substrate having a single crystal film formed on the surface thereof. Among these, a single crystal substrate is more preferable. The film formation process is performed, for example, at a predetermined single crystallization temperature at which single crystallization of a deposited film composed of the raw material component occurs. For example, the single crystallization temperature is empirically determined as a temperature at which single crystallization proceeds depending on the type of raw material component (e.g., GaN), the crystal structure, and the microstructure of the deposited film, such as the crystal grain size and the density. The single crystallization temperature may be set, for example, at 900° C. or higher, 1,000° C. or higher, or 1,200° C. or higher. The single crystallization temperature is preferably set to a range that is lower than the melting point or decomposition temperature of the raw material powder.

In the film formation process, a carrier gas and a pressure regulating gas are each preferably an inert gas. For example, when the raw material powder is a nitride, $N_2$ gas is preferable. Regarding the spraying conditions, preferably, the carrier gas, the pressure regulating gas, and the pressure of the vacuum chamber are adjusted such that a film is formed when spraying is performed at room temperature and the resulting film has a structure in which the crystallite size is 100 nm or less, and the density is 95% or more. In such a manner, the single crystallization temperature can be decreased. The crystallite size can be determined from TEM observation, and the density can be determined from image analysis by SEM observation of a cross section. The spray nozzle is preferably provided with a slit having a long side and a short side. The slit may have a long side with a length of 1 to 10 mm and may have a short side with a length of 0.1 to 1 mm. The thickness of a film to be formed by spraying the raw material powder is preferably 5 μm or less, and more preferably 3 μm or less. The thickness of the film is preferably 0.1 μm or more. When the thickness of the film is set to be 5 μm or less, the density is further improved.

Figure 2:
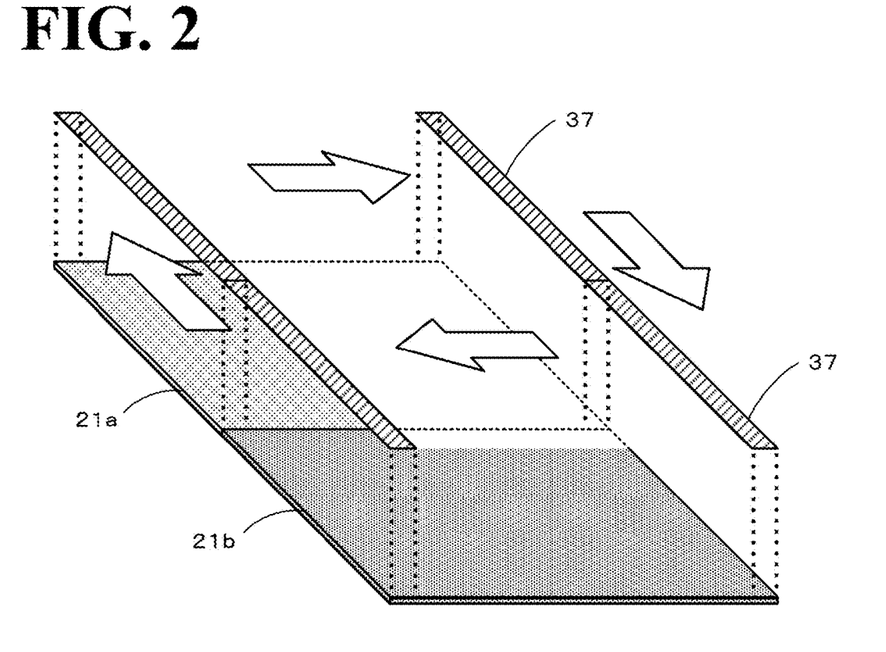
FIG. 2 is a view illustrating a method of scanning with a slit 37.

In the film formation process, when the raw material powder is sprayed through a slit having a long side and a short side, scanning with the slit may be performed. Although scanning with the slit is not particularly limited, film formation may be performed several times on the same area, that is, coating may be repeated. FIG. 2 is a view illustrating a method of scanning with a slit 37. As shown in FIG. 2, when film formation is performed, while spraying a raw material powder through the slit having a long side and a short side, scanning is performed by moving the slit and a seed substrate relative to each other in a direction perpendicular to the long side of the slit, thereby forming a film on the seed substrate (first deposition region 21a). In the crystal production apparatus 20 shown in FIG. 1, the seed substrate 21 is moved by the X-Y stage 33. However, the spray nozzle 36 may be moved instead of moving the X-Y stage. Next, the slit and the seed substrate are moved relative to each other in a direction parallel to the long side of the slit, and then scanning is performed by moving the slit and the seed substrate relative to each other in a direction perpendicular to the long side of the slit at a region adjacent to the film which has been formed on the seed substrate, thereby forming a film adjacent to the film previously formed (second deposition region 21b). This operation may be repeated. By performing such a scanning operation a plurality of times, a single crystal having a relatively large area can be obtained. Furthermore, the deposition intervals become substantially equal over the entire surface, and a homogeneous single crystal can be obtained. Moreover, the thickness of the resulting single crystal can be controlled. In this example, scanning with the slit is performed so as to describe a rectangle. However, scanning with the slit may be performed so as to describe a figure of eight or performed in a zigzag manner, or the slit may be moved in a reciprocating manner. Scanning with the slit is preferably performed at a scanning rate according to the time in which the film is crystallized by the crystallization process which will be described later. The scanning rate can be empirically obtained depending on the type of raw material and the single crystallization temperature. For example, the scanning rate is preferably set to a range of 0.1 to 10 mm/s. In the case where the raw material powder is sprayed repeatedly, another spraying operation may be performed on the film which has been formed by a previous spraying operation and crystallized, or another spraying operation may be performed on the film which has been formed by a previous spraying operation but not crystallized. In the film formation process, for example, if the thickness of a portion which is not single-crystallized is 2 µm or less, this portion may remain.

Figure 3:
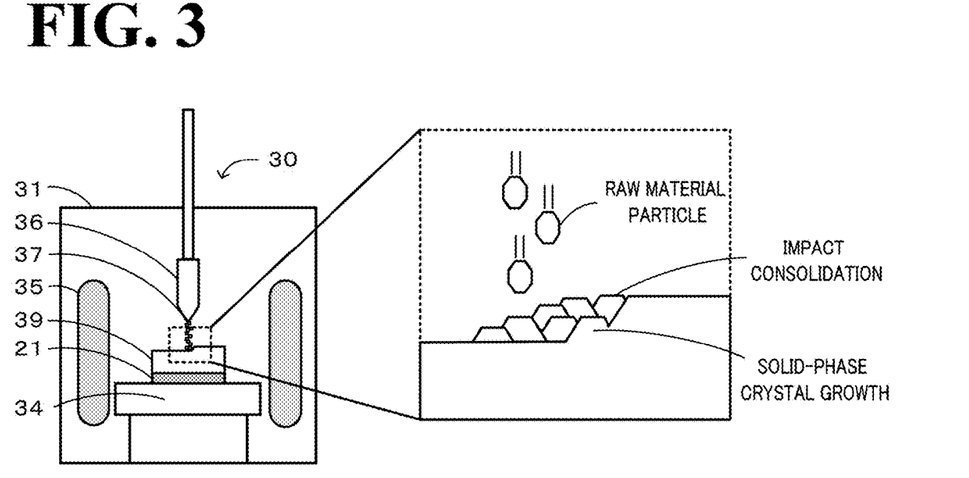
FIG. 3 is a view illustrating a crystallization process.

The crystallization process is performed while maintaining the temperature in the film formation process (single crystallization temperature). In the crystallization process, a film composed of raw material particles formed on the substrate in the film formation process is crystallized under the single crystallization temperature. The single crystallization temperature is the same temperature as that described for the film formation process and, for example, may be 900° C. or higher, 1,000° C. or higher, or 1,200° C. or higher. The single crystallization temperature is preferably set to a range that is lower than the melting point of the raw material powder. FIG. 3 is a view illustrating a crystallization process. As shown in FIG. 3, in the film formation process, sprayed raw material particles are collided with a substrate (seed substrate) and impact consolidation occurs on the substrate to form a deposited film 39. Since the film formation process is performed in the atmosphere at the single crystallization temperature, the impact-consolidated raw material particles are successively subjected to solid-phase crystal growth and single-crystallized. Alternatively, crystal growth with high orientation and density occurs. In such a manner, a three-dimensionally oriented crystal can be obtained. In addition, the resulting crystal is preferably single crystalline. However, the resulting crystal may contain a portion that is not single crystalline, or may be polycrystalline and three-dimensionally oriented.

In the crystal production method according to the embodiment described above, it is possible to fabricate a crystal having better orientation and density. Furthermore, it is possible to obtain a thick crystal (single crystal) having a very small amount of voids. The reason for this is assumed to be that, for example, in the crystal production method according to the present invention, the deposited dense film formed at a predetermined single crystallization temperature is single-crystallized successively on the seed substrate. Therefore, voids are unlikely to occur, and it is possible to fabricate a crystal having better orientation and density. Furthermore, since raw material particles are sprayed at the single crystallization temperature, crystals can be easily grown using raw material powders having a very high melting point (e.g., nitrides) or raw material powders which are apt to be decomposed (e.g., carbides).

It is to be understood that the present invention is not limited to the embodiment described above, and various embodiments within the scope of the technical field of the present invention can be carried out.

Figure 4:
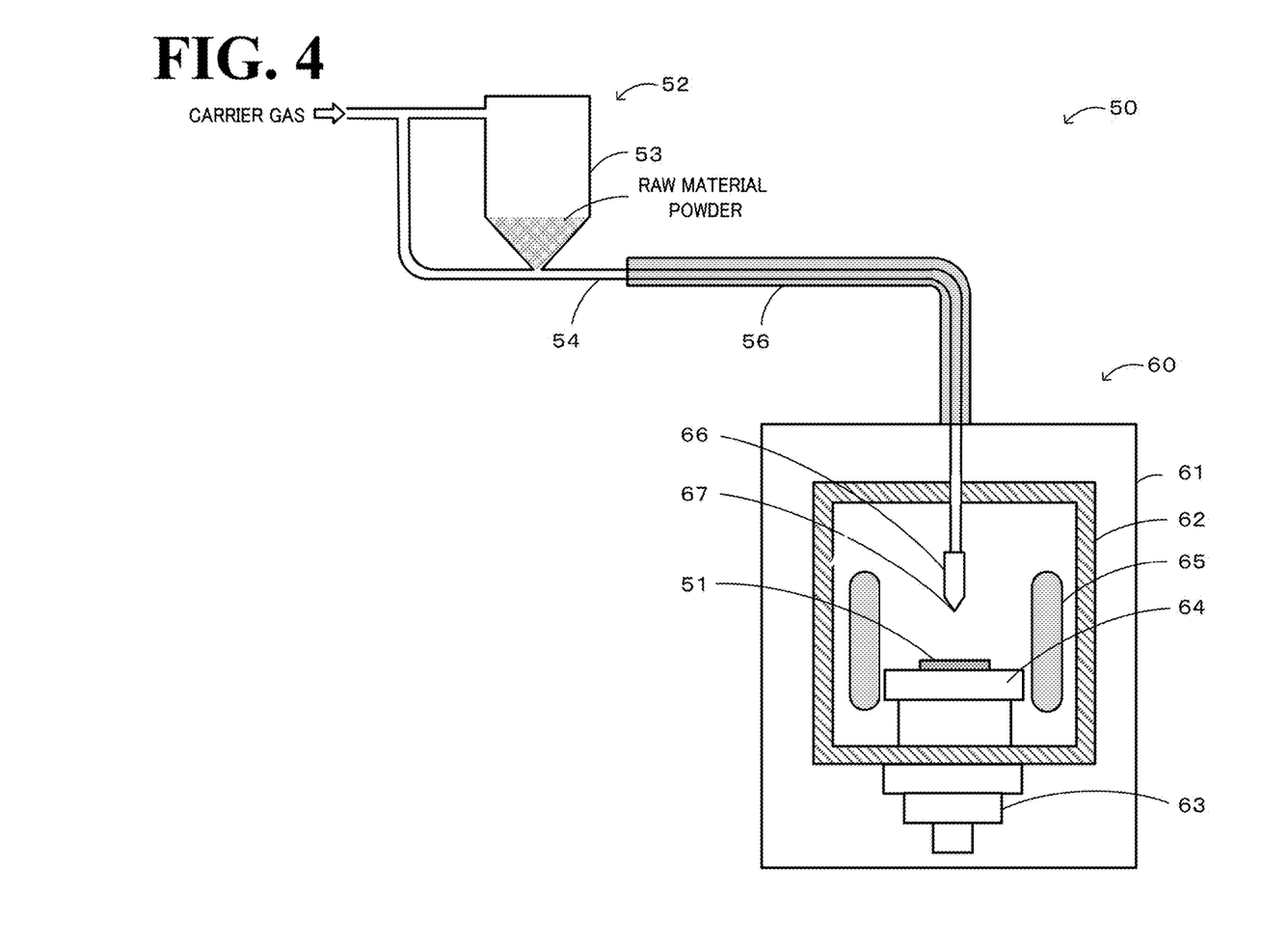
FIG. 4 is a schematic view showing a structure of a crystal production apparatus 50.

For example, in the embodiment described above, the crystal production apparatus 20 is used, the apparatus being used for the aerosol deposition process in which a raw material powder is sprayed onto a seed substrate in an atmosphere having a pressure lower than the atmospheric pressure. However, the present invention is not particularly limited thereto. As shown in FIG. 4, a crystal production apparatus 50 may be used, the apparatus being used in a powder jet deposition process in which a raw material powder is sprayed onto a seed substrate in an atmosphere having the atmospheric pressure or having a pressure higher than the atmospheric pressure. FIG. 4 is a schematic view showing a structure of the crystal production apparatus 50 used in the crystal production method of the present invention. The crystal production apparatus 50 includes a jet powder generation unit 52 which generates a raw material fluid including a raw material powder and a carrier gas, and a crystal formation unit 60 which sprays the raw material powder onto a seed substrate 51 to form a film containing a raw material component and crystallizes the film. The jet powder generation unit 52 includes a pressure tank 53 which contains the raw material powder and receives the supply of a carrier gas from a gas cylinder (not shown), and a raw material feed pipe 54 which feeds the resulting aerosol into the crystal formation unit 60. A preheating device 56 which preheats the raw material fluid is placed on the crystal formation unit 60 side of the raw material feed pipe 54 such that the preheated raw material fluid can be supplied into the crystal formation unit 60. The crystal formation unit 60 includes a chamber 61 in which the raw material fluid is sprayed onto the seed substrate 51 under ordinary pressure, a compartment-like heat insulator 62 provided inside the chamber 61, a substrate holder 64 which is placed inside the heat insulator 62 and fixes the seed substrate 51, and an X-Y stage 63 which moves the substrate holder 64 in the X-axis and Y-axis directions. Furthermore, the crystal formation unit 60 includes a heating member 65 which is placed inside the heat insulator 62 and heats the seed substrate 51, and a spray nozzle 66 which has a slit 67 on the head and sprays the raw material fluid onto the seed substrate 51. In the crystal production apparatus 50, the individual members are composed of quartz glass, a ceramic, or the like so that heat treatment can be performed at a temperature at which single crystallization of the raw material powder occurs, for example, at 900° C. or higher, in the chamber 61. A film formation and crystallization step is carried out using the crystal production apparatus 50, which includes a film formation process of spraying a raw material powder containing a raw material component to form a film containing the raw material component on a seed substrate containing a single crystal at a predetermined single crystallization temperature at which single crystallization of the raw material component occurs, and a crystallization process of crystallizing the film containing the raw material while maintaining the single crystallization temperature. Regarding the spraying conditions, the carrier gas and the pressure of the chamber may be adjusted such that a film is formed when spraying is performed at room temperature and the resulting film has a structure in which the crystallite size is 100 nm or less, and the density is 95% or more. Other conditions can be set according to the conditions of the AD process described above. In such a manner, it is also possible to fabricate a crystal having better orientation and density.

Figure 5:
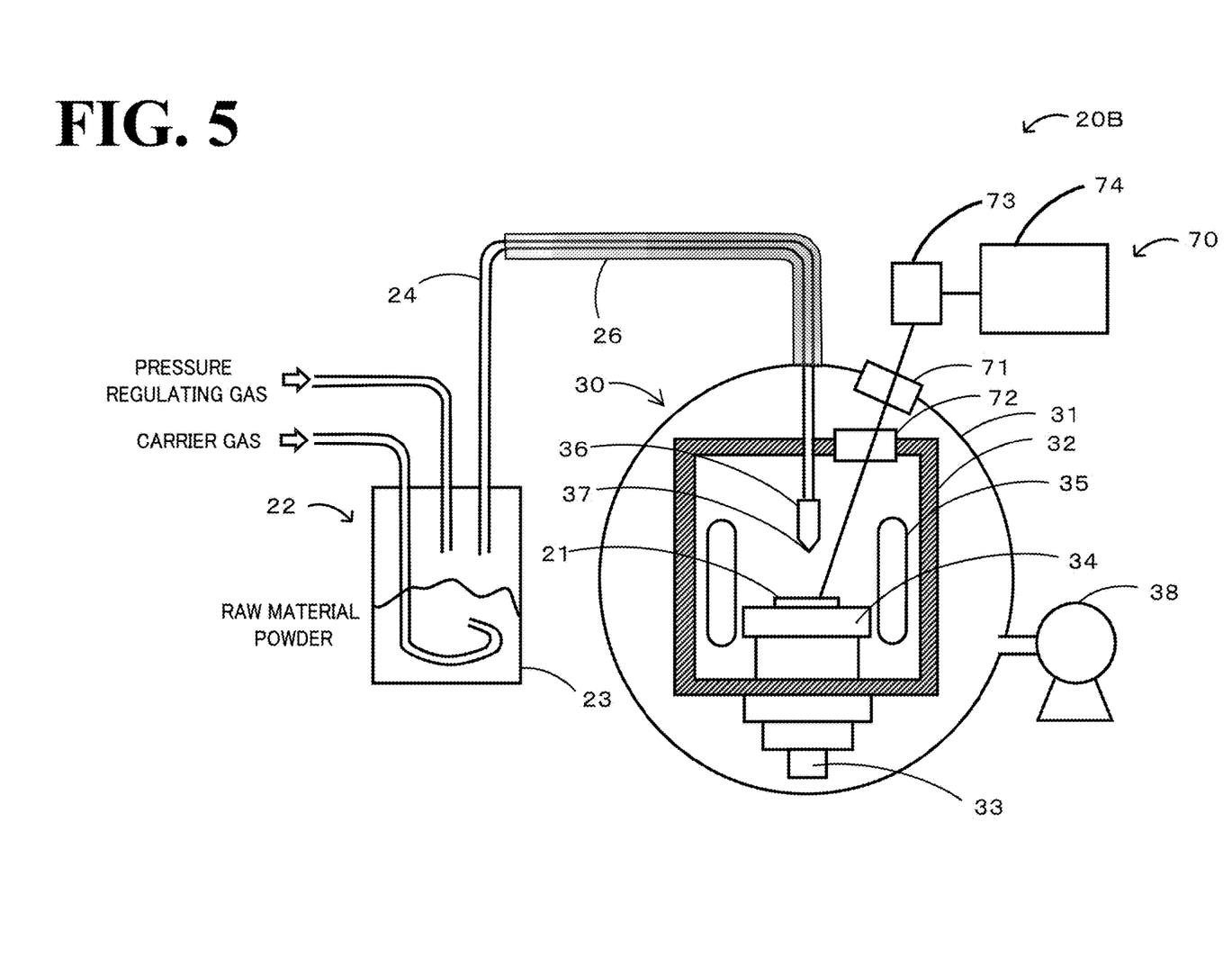
FIG. 5 is a schematic view showing a structure of a crystal production apparatus 20B.

In the embodiment described above, in the crystal production apparatus 20, the film-forming chamber including the seed substrate 21 (inside the heat insulator 32) is wholly heated by the heating member 35 placed inside the heat insulator 32. However, the present invention is not particularly limited thereto. The temperature control of the film-forming chamber (inside the heat insulator 32) may be performed by, in addition to the heating member 35 (heater) inside the film-forming chamber, heating the substrate portion only by another heating source. For example, as shown in FIG. 5, in addition to a heating member 35, a heating device 70 which heats a seed substrate 21 from the outside of a vacuum chamber 31 may be used. FIG. 5 is a schematic view showing a structure of a crystal production apparatus 20B. The crystal production apparatus 20B includes, in addition to the crystal production apparatus 20 (refer to FIG. 1), a heating device 70 which performs laser irradiation. In the crystal production apparatus 203, the same components as those in the crystal production apparatus 20 are denoted by the same reference numerals, and a description thereof will be omitted. In the crystal production apparatus 203, a transmissive window 71 is placed on the vacuum chamber 31 between the heating device 70 and the substrate holder 34, and a transmissive window 72 is placed on the heat insulator 32 so that the laser beam from the heating device 70 can be radiated onto the substrate holder 34. The heating device 70 includes an optical system 73 which can adjust the range of laser irradiation onto the substrate holder 34, and a laser generator 74 which generates a laser beam for heating. The crystal production apparatus 20B is configured such that, by radiating the laser beam generated by the laser generator 74 through the optical system 73 and the transmissive windows 71 and 72 onto the substrate holder 34, the seed substrate 21 can be wholly or partially heated. The heating source for the substrate portion is not particularly limited, and examples thereof that can be used include various lasers, such as $CO_2$ lasers, YAG lasers, excimer lasers, and semiconductor lasers; and infrared lamps. An infrared lamp may be installed in the vicinity of the seed substrate inside the chamber to heat the substrate portion. Alternatively, an infrared lamp may be installed outside the chamber and infrared light may be introduced using an infrared guide rod. In the heating source described above, the output of the heating member 35 can be lowered, and the amount of energy consumption during single crystal fabrication can be reduced. Furthermore, since the seed substrate 21 can be directly heated and the level of heat resistance required for the crystal formation unit 30 is decreased, it is possible to further improve selectivity and durability of the members constituting the crystal production apparatus 20. In addition, if the seed substrate 21 is heated only by the heating source that heats the substrate portion only, under the influence of the thermophoresis effect in which the gas flow is forced back from the surface of the substrate owing to the difference in temperature between the seed substrate 21 and the aerosol gas flow, film formation may become difficult in some cases. Therefore, it is preferable to use both the heating member 35 which heats the whole film-forming chamber and the heating source (heating device 70) which heats only the substrate portion so that the difference in temperature between the film-forming chamber and the seed substrate 21 can be set to be within a predetermined range.

Preferably, the difference in temperature between the film-forming chamber and the seed substrate 21 is 700° C. or lower.

In the embodiments described above, the spray nozzle is provided with a slit. However, the opening of the spray nozzle is not particularly limited thereto, and as long as the raw material powder can be sprayed, the spray nozzle may have a hole in the shape of a circle, ellipse, or polygon.

In the embodiments described above, the crystal production apparatus 20 or 20B, or the crystal production apparatus 50 is used. However, the apparatus is not limited thereto, and as long as the film formation and crystallization step can be carried out, an apparatus other than the crystal production apparatuses 20 and 20B and the crystal production apparatus 50 may be used.

EXAMPLES

Examples in which production was performed specifically using the crystal production method will be described below.

Example 1

GaN powder (manufactured by Kojundo Chemical Laboratory Co., Ltd., average primary particle size: 0.2 μm) was used as a raw material powder, and a GaN single crystal substrate (13 mm×18 mm rectangular, (002) plane) was used as a seed substrate. Furthermore, a GaN single crystal was produced using a crystal production apparatus for an AD process, shown in FIG. 1, in which the chamber internal temperature corresponded to 1,200° C. Regarding production conditions, first, spraying conditions were set such that $N_2$ was used as each of the carrier gas and the pressure regulating gas. A ceramic nozzle having a slit with long side 5 mm×short side 0.3 mm was used. Scanning with the nozzle was performed under the conditions of a scanning rate of 0.5 mm/s and 200 cycles, one cycle including movement by 10 mm in a direction perpendicular to the long side of the slit and in the advancing direction, movement by 5 mm in the long side direction of the slit, movement by 10 mm in the direction perpendicular to the long side of the slit and in the returning direction, and movement by 5 mm in the long side direction of the slit and toward the initial position, as shown in FIG. 2. When the film was formed in one cycle at room temperature, the pressure of the carrier gas was set at 0.06 MPa, the flow rate was adjusted to 6 L/min, the flow rate of the pressure regulating gas was adjusted to 0 L/min, and the chamber internal pressure was adjusted to 100 Pa or less. At this time, the film structure had a crystallite size of 100 nm or less and a density of 950 or more. Under such spraying conditions, as crystal growth conditions, the temperature of the film-forming chamber, i.e., the single crystal growth temperature, was set at 1,050° C. The resulting single crystal had a thickness of 0.5 mm.

Example 2

ZnO powder (manufactured by Kojundo Chemical Laboratory Co., Ltd., average primary particle size: 0.5 μm) was used as a raw material powder, and a ZnO single crystal substrate (10 mm×10 mm square, (002) plane) was used as a seed substrate. The same apparatus as that in Example 1 was used for crystal production. The film formation conditions by the AD process were the same as those in Example 1 except that He was used as each of the carrier gas and the pressure regulating gas, and the size of the spray nozzle was long side 10 mm×short side 0.4 mm. At this time, the film structure had a crystallite size of 100 nm or less and a density of 98% or more. Under such spraying conditions, as crystal growth conditions, the temperature of the film-forming chamber, i.e., the single crystal growth temperature, was set at 1,250° C. The resulting single crystal had a thickness of 0.8 mm.

Example 3

The same raw material powder and seed substrate as those in Example 2 were used. A crystal production apparatus 20B in which a laser heating device 70 was added to the crystal production apparatus 20 used in Example 1 or 2 was used (refer to FIG. 5). In this apparatus, the temperature of the film-forming chamber was set at 800° C., and the single crystal substrate portion was heated to 1,250° C. by a $CO_2$ laser. At this time, the laser output was 80 W, and the beam diameter was 10 mm. A single crystal was produced under the same film formation conditions, such as the nozzle size, as those in Example 2. The resulting single crystal had a thickness of 0.8 mm.

Comparative Example 1

In Example 1, by setting the temperature of the film-forming chamber at room temperature and setting the number of scanning operations to be 20 cycles, a film containing the raw material component was formed on the seed substrate. Then, by performing heat treatment for one hour in a $N_2$ atmosphere at 1,200° C., the resulting film was crystallized. At this time, the temperature as increased at 50° C./h from 900° C. to 1,200° C. A crystal of Comparative Example 1 was obtained by such a method in which the film forming step and the crystallization step were performed separately. The resulting single crystal had a thickness of 0.04 mm. In addition, even when the number of scanning operations was increased, the thickness did not change substantially.

Electron Microscope (SEM) Photographing

In order to evaluate the products of Examples 1 to 3 and Comparative Example 1, cross sections were SEM photographed. SEM photographing was carried out using a scanning electron microscope (JSM-6390 manufactured by JEOL Ltd). Samples were polished in a direction parallel to the film surface, and observation was performed at a magnification of 1,000 times. As a result, no voids were observed in Example 1, while 20 or more voids were observed in Comparative Example 1. Furthermore, regarding the single crystals of Examples 2 and 3, cross sections were subjected to SEM observation in the same manner as that in Example 1. As a result, no voids were observed in Examples 2 and 3. Furthermore, XRD profiles for film surfaces were measured with an XRD diffractometer ("D8ADVANCE" manufactured by Bruker AXS). In Example 1, the diffraction peak due to the (002) plane only was observed, and in-plane orientations of regular hexagons, i.e., the morphology appearing in the film surface, were aligned in the same direction. Thus, single crystallization was confirmed. Furthermore, XRD profiles for film surfaces of Examples 2 and 3 were measured. As a result, the diffraction peak due to the (002) plane only was observed, and in-plane orientations of regular hexagons, i.e., the morphology appearing in the film surface, were aligned in the same direction. Thus, single crystallization was also confirmed in Examples 2 and 3. On the other hand, in Comparative Example 1, diffraction peaks other than the (002) were observed, and it was confirmed that the degree of single crystallization was low.

This application claims the benefit of priority from Japanese Patent Application No. 2010-245948 filed Nov. 2, 2010, Japanese Patent Application No. 2011-052458 filed Mar. 10, 2011, and Japanese Patent Application No. 2011-184848 filed Aug. 26, 2011, all of which are hereby incorporated by reference herein in their entireties.

INDUSTRIAL APPLICABILITY

The present invention is applicable to the technical field of producing single crystals.

The invention claimed is:

1. A crystal production method comprising a film formation and crystallization step of spraying a raw material powder containing a raw material component to form a film containing the raw material component on a seed substrate containing a single crystal at a predetermined single crystallization temperature at which single crystallization of the raw material component occurs, and simultaneously crystallizing the resulting film containing the raw material component while maintaining the single crystallization temperature to form a single crystal film, wherein, in the film formation and crystallization step, the film formed by spraying the raw material powder has a thickness of 5 μm or less.

2. The crystal production method according to claim 1, wherein, in the film formation and crystallization step, the single crystallization temperature is 900° C. or higher.

3. The crystal production method according to claim 1, wherein, in the film formation and crystallization step, the raw material component contained in the raw material powder and the seed substrate are each a nitride.

4. The crystal production method according to claim 1, wherein, in the film formation and crystallization step, the raw material component contained in the raw material powder and the seed substrate are each an oxide.

5. The crystal production method according to claim 1, wherein, in the film formation and crystallization step, the film is formed on the seed substrate by performing an operation in which, while spraying the raw material powder through a slit having a long side and a short side, scanning is performed by moving the slit and the seed substrate relative to each other in a direction perpendicular to the long side of the slit, thereby forming a film on the seed substrate, then scanning is performed by moving the slit and the seed substrate relative to each other in a direction parallel to the long side of the slit, and then scanning is performed by moving the slit and the seed substrate relative to each other in a direction perpendicular to the long side of the slit at a region adjacent to the film which has been formed on the seed substrate, thereby forming a film adjacent to the film previously formed, and by repeating the operation.

6. The crystal production method according to claim 1, wherein, in the film formation and crystallization step, the film is formed by an aerosol deposition process in which the raw material powder is sprayed onto the seed substrate in an atmosphere having a pressure lower than the atmospheric pressure, and the film is crystallized.

7. The crystal production method according to claim 1, wherein, in the film formation and crystallization step, the film is formed by a powder jet deposition process in which the raw material powder is sprayed onto the seed substrate in an atmosphere having a pressure not lower than the atmospheric pressure, and the film is crystallized.

* * * * *